United States Patent [19]

Jarvis et al.

[11] Patent Number: 4,539,554
[45] Date of Patent: Sep. 3, 1985

[54] ANALOG INTEGRATED CIRCUIT PRESSURE SENSOR

[75] Inventors: John F. Jarvis, Fair Haven; Robert G. Swartz, Highlands; Bruce A. Wooley, Tinton Falls, all of N.J.

[73] Assignee: AT&T Bell Laboratories, Murray Hill, N.J.

[21] Appl. No.: 434,876

[22] Filed: Oct. 18, 1982

[51] Int. Cl.³ .......................... G06F 3/02; H01L 41/08
[52] U.S. Cl. ................................. 345/365 A; 310/338; 310/339; 340/365 C; 340/365 S
[58] Field of Search ........... 340/365 A, 365 C, 365 S, 340/407; 310/339, 338; 200/DIG. 1

[56] References Cited

U.S. PATENT DOCUMENTS

| | | | |
|---|---|---|---|
| 3,571,733 | 8/1973 | Fletcher . | |
| 3,931,610 | 1/1976 | Marin | 340/365 C |
| 3,935,485 | 1/1976 | Yoshida | 310/339 |
| 3,979,711 | 9/1976 | Maginness . | |
| 4,190,785 | 2/1980 | Kompanek | 340/365 A |
| 4,233,522 | 11/1980 | Grummer | 340/365 C |
| 4,286,129 | 8/1981 | Petit | 200/159 B |
| 4,286,459 | 9/1981 | Trimmer | 73/862.59 |
| 4,290,052 | 9/1981 | Eichelberger | 340/365 C |
| 4,296,406 | 10/1981 | Pearson | 340/365 A |
| 4,306,148 | 12/1981 | Ringwall | 250/229 |
| 4,328,441 | 5/1982 | Kroeger | 340/365 A |
| 4,495,434 | 1/1985 | Diepers | 340/365 C |

OTHER PUBLICATIONS

"Proceedings of the 23rd International Instrumentation Symposium", 1977, Mallon, pp. 443-450.
"Proceedings of the 23rd International Instrumentation Symposium", 1977, Gross, pp. 475-480.
"IEEE/Engineering in Medicine and Biology Society First Annual Conference", Oct. 1979, Sander, pp. 189-192.
"IEEE Southeastcon", 1981, Galey, pp. 174-177.
"Electronics Letters", Oct. 3, 1974, vol. 10, No. 20, pp. 420-421.
"IEEE Transactions on Components, Hybrids, and Manufacturing Tech.", vol. CHMT-4, No. 3, Namiki, Sep. 1981, pp. 304-310.

Primary Examiner—James J. Groody
Attorney, Agent, or Firm—Wendy W. Koba

[57] ABSTRACT

An integrated array of pressure transducers capable of producing an analog output voltage representative of the applied pressure is proposed. The individual transducing elements (16) are defined by a three-layer structure including a thin layer of piezoelectric material (10) disposed between a reference potential plate (12) and a plurality of electrodes (15) contained in a silicon substrate (14). A force applied to a localized portion of the reference plate will cause a deflection of the piezoelectric material towards the electrodes on the substrate, inducing a capacitive charge on the electrode in the localized area. This capacitance is stores at a node A associated with the transducing element, and may be interrogated by a sensing circuit (18) located in the silicon substrate. Since the induced charge is directly proportional to the applied force, a measurement of the output voltage from node A will yield a direct indication of the localized force applied to the sensor.

5 Claims, 4 Drawing Figures

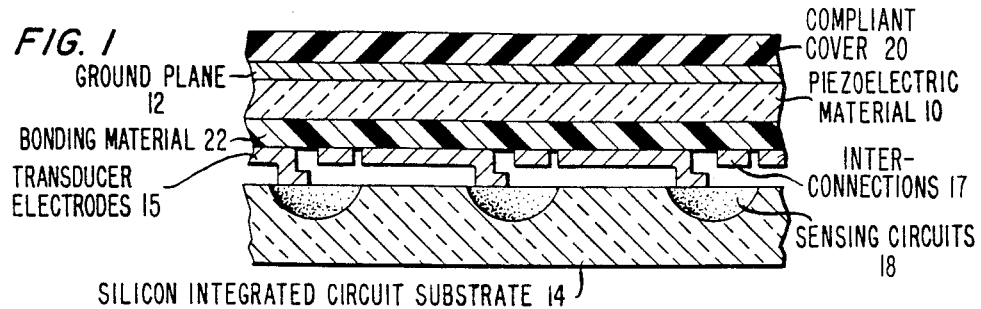
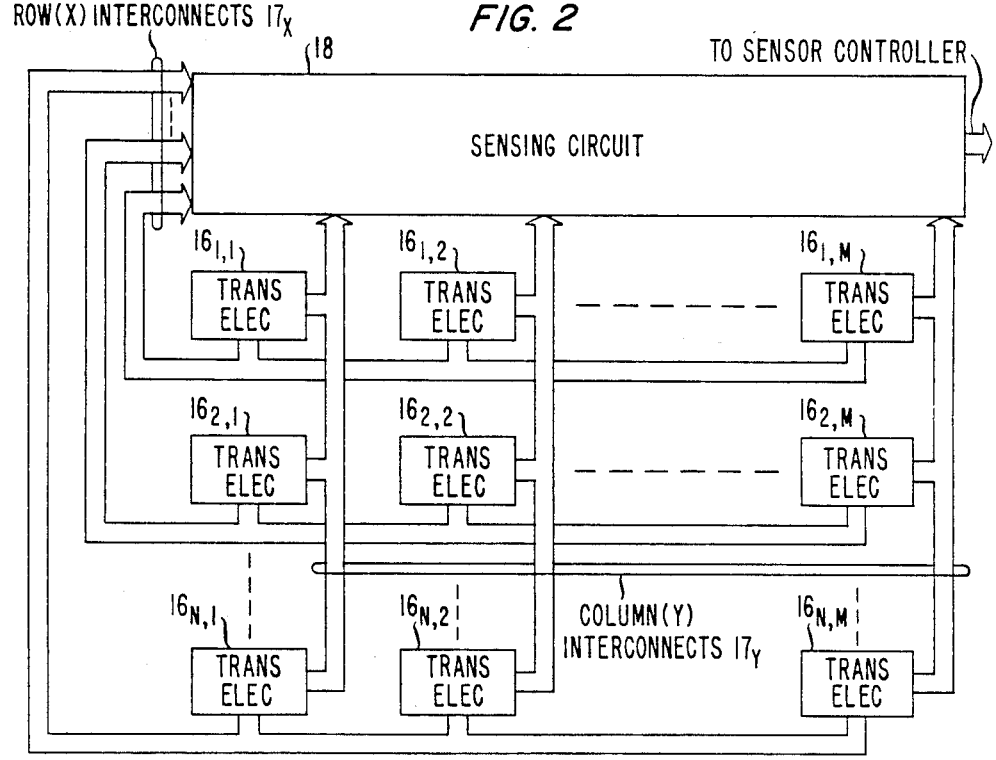
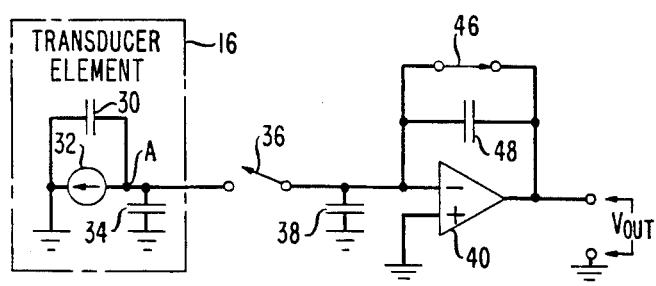

ANALOG INTEGRATED CIRCUIT PRESSURE SENSOR

BACKGROUND OF THE INVENTION

1. Field of the Invention

The present invention relates to a monolithic tactile sensor and, more particularly, to a monolithic tactile sensor which combines considerable spatial resolution with pressure sensing over a range of two orders of magnitude.

2. Description of the Prior Art

The ability of a robot to pick up and manipulate mechanical parts can be greatly improved if the grasping surfaces are able to sense pressure. This type of sensor can be used for object identification as well as for insertion and mating tasks associated with assembly. The preferred location of the sensor is on the extremity of a movable finger. Consequently, the sensor must be compact and rugged and should provide spatial resolution of better than 0.1 inch $^2$/element (one hundred sensing elements per square inch) to be compatible with industrial applications. While some progress has been made in developing tactile (touch) sensors, these sensors are crude in comparison to the available image and audio transducers. Two general methods are used for tactile sensing: force and torque measurements at either the manipulator wrist or at the work piece, and direct "finger-tip" pressure sensing.

One type of force sensor is disclosed in U.S. Pat. No. 4,286,459 issued to W. S. N. Trimmer et al on Sept. 1, 1981. As disclosed, the Trimmer et al force sensor includes at least one strip of flexible piezoelectric material having an electrically conductive coating on opposite sides thereof. When a force is applied to the piezoelectric strip causing it to stretch, the strip will oscillate at a frequency that is determined by the magnitude of the applied force. Accordingly, the magnitude of the applied force can be determined by measuring the frequency of the resulting oscillation.

U.S. Pat. No. 4,306,148 issued to C. G. Ringwall et al on Dec. 15, 1981 discloses an alternative tactile sensor. The Ringwall et al arrangement relates to a tactile area sensor for robots which has an array of pneumatic flow passages. The air flow in each passage is dependent on a localized force excited by an object pressing against an elastic pad on the face of the sensor. The air flow impinges on a metallic tab and its angular displacement is sensed by directing a light beam from an optical fiber onto the tab and monitoring the quantity of light reflected to a paired optical fiber.

An ultrasonic transducer array and imaging system is disclosed in U.S. Pat. No. 3,979,711 issued to M. G. Maginness et al on Sept. 7, 1976. The array comprises a plurality of transducer elements each having a major face capable of bidirectionally transmitting and receiving ultrasonic energy. The opposite face of each element comprises means for bidirectionally providing and receiving electrical energy across each transducer element. In the imaging system, the array may be selectively scanned to provide a fine detail structure image over an extended area.

The provision of "finger-tip" tactile sensing for application to the real time sensory feedback control of mechanical manipulators remains largely an unsolved problem. Progress in this area has been impeded primarily by the lack of an adequate transducer. Factors such as nonlinearity, hysteresis and limited dynamic range have for the most part limited tactile sensors to a simple binary response. The problem remaining in the prior art, therefore, is to provide a "finger-tip" tactile sensor with more than a simple contact/no contact response.

SUMMARY OF THE INVENTION

The problem remaining in the prior art has been solved in accordance with the present invention, which relates to a monolithic tactile sensor and, more particularly, to a monolithic tactile sensor which combines considerable spatial resolution with pressure sensing over a range of two orders of magnitude.

It is an aspect of the present invention to provide an array of pressure transducers, formed by means of a thin layer of piezoelectric material sandwiched between a reference potential plate and a silicon substrate, which will provide linear sensing over a dynamic range of at least four bits.

It is another aspect of the present invention to provide a monolithic array of pressure transducers suitable for "finger-tip" tactile sensing applications where the array structure is compatible with conventional MOS integrated circuit processing.

Other and further aspects of the present invention will become apparent during the course of the following description and by reference to the accompanying drawings.

BRIEF DESCRIPTION OF THE DRAWINGS

In the following drawings, where like numerals represent like parts in several views:

FIG. 1 illustrates a cross-sectional view of the basic structure of an exemplary tactile sensing array formed in accordance with the present invention;

FIG. 2 illustrates an exemplary interconnection of a plurality of electrodes and the sensing circuitry associated therewith in accordance with the present invention;

FIG. 4 illustrates an exemplary column preamplifier arrangement employed in association with the exemplary arrangement illustrated in FIGS. 1 and 2.

DETAILED DESCRIPTION

Figure 3:
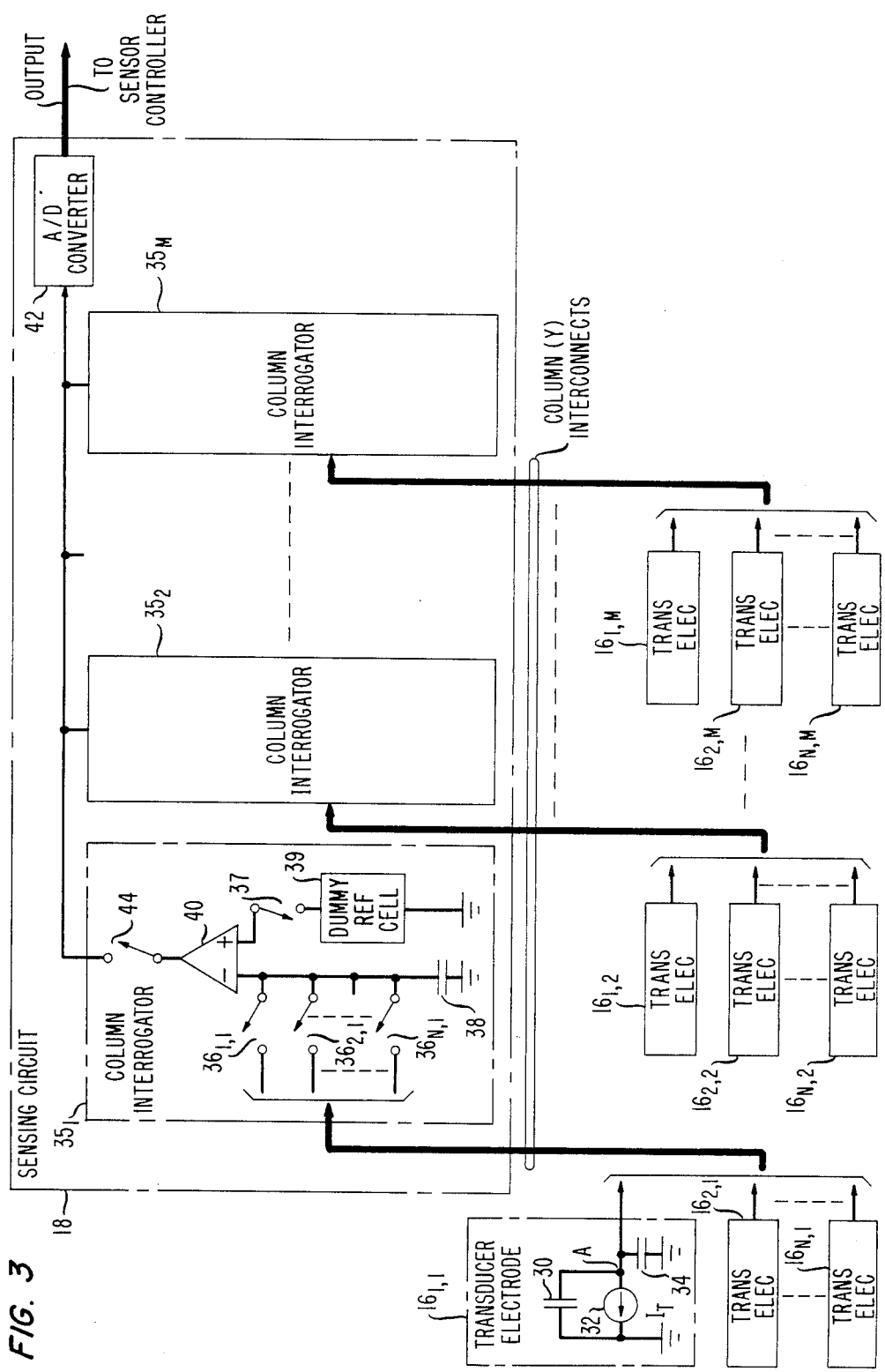
FIG. 3 illustrates an exemplary arrangement of a sensing circuit which may be used to interrogate the individual elements in a tactile sensing array.

A cross-sectional view of the basic structure of an exemplary tactile sensing array formed in accordance with the present invention is illustrated in FIG. 1. A layer of pressure sensitive piezoelectric material 10 is disposed between a ground (or dc) plane 12 and a silicon integrated circuit substrate 14. A plurality of individual transducing elements 16 are defined by electrodes formed on substrate 14 and these electrodes are connected via interconnections 17 to a sensing circuit 18 (not shown) which are integrated in substrate 14. Sensing circuit 18 defines the array size and number of the individual pressure sensitive cells and provides the necessary circuitry to scan and multiplex the signals from each cell to a common output. Each cell is thus a capacitor where the instantaneous charge is dependent on both the histories of force applied to the cell and readout of the cell by the associated electronics. A bonding layer 22 connects piezoelectric layer 10 to substrate 14 and the entire device is covered by a compliant cover 20 which converts vertical displacement to pressure and also provides mechanical protection.

In accordance with the present invention, piezoelectric layer 10 of FIG. 1 should be thin and locally conformable so as to localize the influence of pressure applied in the region of a single transducing element 16. Piezoelectric layer 10 should also provide as high an electromechanical coupling as possible. One example of such material is the piezoelectric polymer polyvinylidene fluoride ($PVF_2$).

A top view of an exemplary arrangement of the present invention comprising a matrix arrangement of electrodes is illustrated in FIG. 2. The individual electrodes $16_{1,1}$–$16_{N,M}$ are arranged in an NxM matrix format, with row interconnections (X) $17_x$ and column interconnections (Y) $17_y$ to sensing circuit 18. It is to be understood that such an arrangement is exemplary only, and the individual electrodes may be disposed in any suitable arrangement in accordance with the present invention. In the arrangement of FIG. 2, sensing circuit 18 interrogates transducer elements $16_{1,1}$–$16_{N,M}$ by their row x and column y address to ascertain the change in force applied thereto. It is to be understood that within the capabilities of the silicon integrated circuit technology, transducing elements $16_{1,1}$–$16_{N,M}$ may assume a variety of planar geometries, and the individual elements themselves may be of arbitrary shape and size. For a "fingertip" tactile sensor, a square array of, for example, 16×16 elements integrated in an area of one square centimeter is appropriate for providing effective spatial resolution.

As mentioned hereinbefore, each sensing element may be viewed as a capacitor with piezoelectric layer 10 forming the dielectric. A change in force applied to compliant cover 20 is transferred through piezoelectric layer 10 and induces a charge on a transducer element $16_{i,j}$ directly under the area of compliant cover 20 which received the force. If the associated transducer element $16_{i,j}$ is connected to a high impedance node in sensing circuit 18, the charge can be accumulated over a predetermined interval of time and then sensed to determine the net change in force applied to transducer element $16_{i,j}$. For example, for a 30 $\mu$m thick piezoelectric layer 10 of $PVF_2$, a pressure of 9.8 $N/cm^2$ will induce a charge of approximately $3\times10^{-10}$ Coul/$cm^2$. If transducer element $16_{i,j}$ is isolated from significant parasitic capacitance, the resulting voltage induced will be approximately 0.75 volts. However, in a practical device, parasitics may reduce this voltage level by as much as an order of magnitude.

An exemplary 16×16 array of transducer elements $16_{1,1}$–$16_{N,M}$ may typically be scanned at a rate of at least 100 times/second. At this rate, each transducer element $16_{1,1}$–$16_{N,M}$ is interrogated every 10 msec, and thus, a total of 40 $\mu$sec would be available for sensing an individual transducer element $16_{i,j}$. The leakage discharge time constant for the charge storage node associated with a transducer element $16_{i,j}$ must be large in comparison with the scan cycle time. To avoid errors due to the long term accumulation of leakage charge, only the change in charge during a single cycle is sensed. This is accomplished by discharging the lower transducer electrode to a reference potential at the end of the sensing interval.

An arrangement of sensing circuit 18 which may be used to interrogate the individual elements in a tactile sensing array formed in accordance with the present invention is illustrated in FIG. 3. In this low-frequency representation, an exemplary transducer element $16_{i,j}$ is modeled by a first capacitor 30 and a current source 32. A second capacitor 34 represents the parasitic capacitance between the lower electrode of transducer element $16_{i,j}$ and substrate 14. A change in pressure on the portion of compliant cover 20 above transducer element $16_{i,j}$ results in an injection of charge proportional to that change in pressure into a node A common to capacitors 30 and 34.

Access to an individual transducer element $16_{i,j}$ from a column line j is provided by a switch 36. When switch 36 is closed, the charge stored on capacitors 30 and 34 is redistributed between them and a column line parasitic capacitance 38. Switch 36 may be controlled via sensing circuit 18 either by both row (x) and column (y) addressing or simply by column addressing. In the latter case, an entire column of transducer elements is accessed at one time. A plurality of low-noise column preamplifiers $40_1$–$40_N$ interconnect a plurality of switches $36_{1,1}$–$36_{N,M}$ to a plurality of N column output lines of the array, where, for example, preamplifier $40_j$ is connected to transducer elements $16_{j,1}$–$16_{j,N}$. Preamplifiers $40_1$–$40_N$ function to convert the charge applied as an input to a voltage level at the output. The outputs from preamplifiers $40_1$–$40_N$ are subsequently multiplexed onto the input of an A/D converter 42 via a plurality of multiple switches $44_1$–$44_N$. The output of A/D converter 42 is subsequently transferred to robotic sensing circuitry (not shown) which controls the manipulation of the device containing a tactile sensor formed in accordance with the present invention.

To obtain as large a dynamic range as possible, a balanced sensing configuration may be emloyed in association with the present invention. It is to be understood that such a balancing arrangement is exemplary only, and merely affects the dynamic range of operation of the present invention. In the arrangement illustrated in FIG. 3, a dummy switch 37 and a dummy reference cell 39 are included to achieve the balanced configuration, where one such dummy cell and dummy switch are included in each column of the array. Dummy reference cell 39 is identical in structure to the above-described transducer $16_{i,j}$ except that its associated storage node A is set to the cell dc reference potential prior to sensing.

An exemplary arrangement of a transducer $16_{i,j}$ and column preamplfier $40_j$ is illustrated in FIG. 4. Prior to accessing the transducer cell, switch 36 is open and an amplifier switch 46 is closed, thus, feedback capacitor 48 is discharged and the column line is effectively clamped to an equivalent differential ground. Upon access to transducer element $16_{i,j}$, amplifier switch 46 is opened and cell switch 36 is closed. In this condition, transducer cell node A is discharged to ground through capacitor 34, and its charge is transferred to a feedback capacitor 48. It is the action of operational amplifier $40_j$ that serves to drive the column line associated therewith to ground.

Prior to the access of transducer element $16_{i,j}$, a voltage $V_T$ and corresponding charge $Q_T$, where $Q_T=(C_{30}+C_{34})V_T$ and $C_{30}$ is the capacitance value of capacitor 30 and $C_{34}$ is the capacitance value of capacitor 34, have been induced on the cell node A. Following the access of element $16_{i,j}$, the output of amplifier $40_j$ will settle to a voltage $$V_{out} = -\frac{Q_T}{C_{48}} = -V_T \left| \frac{C_{30} + C_{34}}{C_{48}} \right|. \tag{1}$$

Thus, the voltage $V_{out}$ depends, to first order, only on the charge induced in transducer element $16_{i,j}$ and feedback capacitor 48. After access to transducer element $16_{i,j}$, the position of switches 36 and 46 are reversed and the process is repeated.

What is claimed is:

1. An analog integrated circuit pressure sensor comprising
    a pressure sensitive piezoelectric material layer (10) having a substantially parallel top and bottom surfaces;
    a silicon substrate layer (14) disposed underneath the bottom surface of said pressure sensitive piezoelectric material and including a plurality of individual electrodes (15) formed on the surface thereof and in direct contact with said bottom surface of said piezoelectric material;
    a ground plane layer (12) disposed directly in contact with the top surface of said piezoelectric material, the combination of said ground plane layer, said piezoelectric material layer, and said plurality of individual electrodes being defined as a plurality of capacitive transducing elements (16); and
    a layer of compliant material (20) disposed to cover the major exposed surface of said ground plane layer and capable of being locally displaced towards said silicon substrate by a locally applied pressure, said locally applied pressure inducing a charge on a capacitive transducing element of said plurality of transducing elements located in the region of said applied force for producing as an output of said pressure sensor an analog voltage signal proportional to the force of the locally applied pressure.

2. An analog integrated pressure sensor formed in accordance with claim 1 wherein the pressure sensor further comprises
    a plurality of switching elements (36), each switching element connected to a separate one the plurality of individual transducing elements; and
    a plurality of amplifiers (40), each amplifier connected to a separate subset of said plurality of switching elements for receiving as an input the plurality of output voltages produced by the associated subset of transducing elements and producing as an output an analog voltage equal to the combination of the plurality of output voltages produced by the associated subset of transducing elements.

3. An analog integrated circuit pressure sensor formed in accordance with claim 2 wherein the plurality of individual electrodes included in the silicon substrate are arranged in an array structure comprising a plurality of N rows and a plurality of M columns, where N may be equal to M.

4. An analog integrated circuit pressure sensor formed in accordance with claim 3 wherein each amplifier of the plurality of amplifiers is associated with a separate column of the M columns of individual electrodes.

5. An analog integrated circuit pressure sensor formed in accordance with claim 1 wherein the pressure sensitive piezoelectric material comprises polyvinylidene fluoride.

* * * * *